United States Patent
Shindome et al.

(10) Patent No.: US 10,431,657 B1
(45) Date of Patent: Oct. 1, 2019

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Aya Shindome, Yokohama (JP); Masahiko Kuraguchi, Yokohama (JP); Tatsuo Shimizu, Shinagawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/056,917

(22) Filed: Aug. 7, 2018

(30) Foreign Application Priority Data

Mar. 13, 2018 (JP) .................. 2018-045535

(51) Int. Cl.
*H01L 29/40* (2006.01)
*H01L 29/778* (2006.01)
(Continued)

(52) U.S. Cl.
CPC ........ *H01L 29/402* (2013.01); *H01L 29/4236* (2013.01); *H01L 29/7787* (2013.01);
(Continued)

(58) Field of Classification Search
CPC ............. H01L 29/7787; H01L 29/2003; H01L 29/518; H01L 29/517; H01L 29/0847; H01L 29/205; H01L 29/66462
(Continued)

(56) References Cited

U.S. PATENT DOCUMENTS 8,283,699 B2  10/2012  Wu
8,765,554 B2  7/2014  Imada et al.
(Continued)

FOREIGN PATENT DOCUMENTS

JP  2008-124440  5/2008
JP  2012-178416  9/2012
(Continued)

*Primary Examiner* — Thinh T Nguyen
(74) *Attorney, Agent, or Firm* — Oblon, McClelland, Maier & Neustadt, L.L.P.

(57) ABSTRACT

According to one embodiment, a semiconductor device includes first and second semiconductor regions, first to third electrodes, a conductive portion, first and second insulating layers. The first, second and third electrodes are separated from the first semiconductor region. The conductive portion is separated from the first semiconductor region. The second semiconductor region includes first to third partial regions. The first and second partial regions are electrically connected to the first and second electrodes, respectively. The third partial region is positioned between the second portion and the first semiconductor region. A portion of the first insulating layer is provided between the first portion and the first semiconductor region. The second insulating layer includes first and second insulating portions. The first insulating portion is positioned between the second portion and the third partial region. The second insulating portion is positioned between the conductive portion and the second semiconductor region.

20 Claims, 7 Drawing Sheets

(51) Int. Cl.
*H01L 29/423* (2006.01)
*H01L 29/20* (2006.01)
*H01L 29/205* (2006.01)

(52) U.S. Cl.
CPC ........ *H01L 29/2003* (2013.01); *H01L 29/205* (2013.01); *H01L 29/404* (2013.01)

(58) Field of Classification Search
USPC .......................... 257/76, 85; 438/22, 24, 46
See application file for complete search history.

(56) References Cited

U.S. PATENT DOCUMENTS

| | | | |
|---|---|---|---|
| 2009/0108299 A1* | 4/2009 | Smorchkova | H01L 29/404 257/194 |
| 2012/0214294 A1* | 8/2012 | Kon | H01L 29/7787 438/478 |
| 2014/0264431 A1 | 9/2014 | Lal | |
| 2016/0260615 A1 | 9/2016 | Hirai et al. | |

FOREIGN PATENT DOCUMENTS

| | | |
|---|---|---|
| JP | 2012-191224 | 10/2012 |
| JP | 2016-39327 | 3/2016 |
| JP | 2016-515307 | 5/2016 |
| JP | 2016-162879 | 9/2016 |

* cited by examiner

//==SEMICONDUCTOR DEVICE

CROSS-REFERENCE TO RELATED APPLICATIONS

This application is based upon and claims the benefit of priority from Japanese Patent Application No. 2018-045535, filed on Mar. 13, 2018; the entire contents of which are incorporated herein by reference.

FIELD

Embodiments described herein relate generally to a semiconductor device.

BACKGROUND

It is desirable to stabilize the characteristics of a semiconductor device.

DETAILED DESCRIPTION

Figure 1:
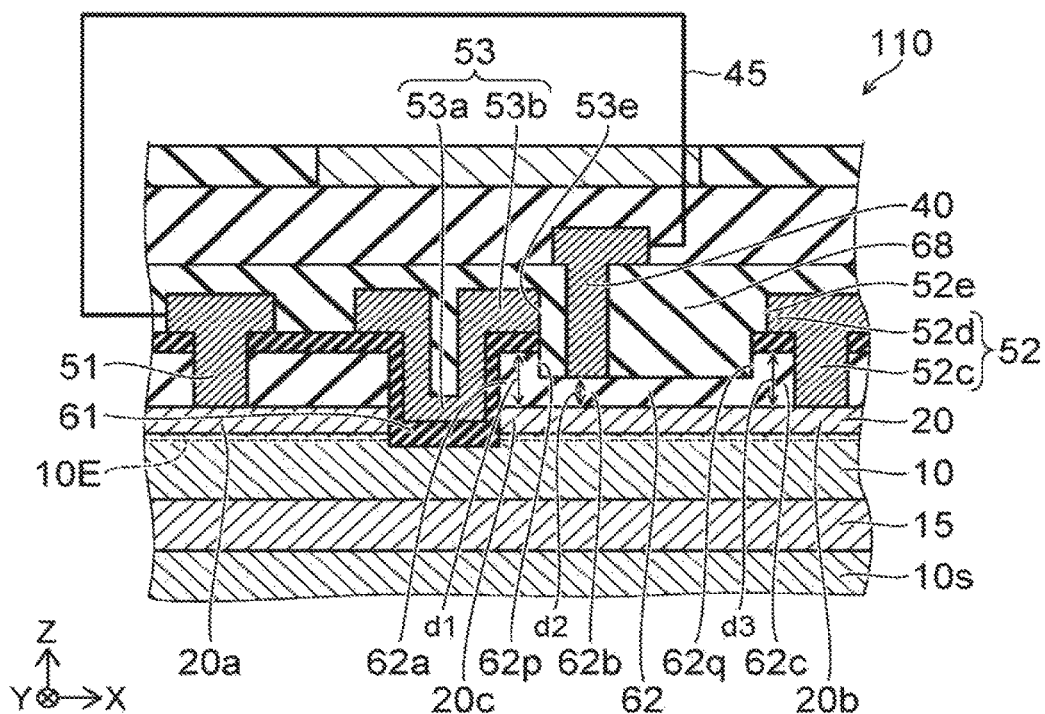
FIG. 1 is a schematic cross-sectional view illustrating a semiconductor device according to a first embodiment.

According to one embodiment, a semiconductor device includes a first semiconductor region including $Al_{x1}Ga_{1-x1}N$ (0≤x1<1), a second semiconductor region including $Al_{x2}Ga_{1-x2}N$ (0<x2≤1 and x1<x2), first to third electrodes, a conductive portion, a first insulating layer, and a second insulating layer. The first electrode is separated from the first semiconductor region in a first direction. The second electrode is separated from the first semiconductor region in the first direction. A second direction from the first electrode toward the second electrode crosses the first direction. The third electrode is separated from the first semiconductor region in the first direction. A position in the second direction of the third electrode is between a position in the second direction of the first electrode and a position in the second direction of the second electrode. The third electrode includes a first portion and a second portion. The conductive portion is separated from the first semiconductor region in the first direction. A position in the second direction of the conductive portion is between the position in the second direction of the third electrode and the position in the second direction of the second electrode. The second semiconductor region includes first to third partial regions. The first partial region is electrically connected to the first electrode. The second partial region is electrically connected to the second electrode. The third partial region is positioned between the second portion and the first semiconductor region in the first direction. A portion of the first insulating layer is provided between the first portion and the first semiconductor region in the first direction. A direction from at least a part of the first insulating layer toward the second semiconductor region is aligned with the second direction. The second insulating layer includes a first insulating portion and a second insulating portion. The first insulating portion is positioned between the second portion and the third partial region in the first direction. The second insulating portion is positioned between the conductive portion and the second semiconductor region in the first direction. A first length along the first direction of the first insulating portion is longer than a second length along the first direction of the second insulating portion.

According to another embodiment, a semiconductor device includes a first semiconductor region including $Al_{x1}Ga_{1-x1}N$ (0≤x1<1), a second semiconductor region including $Al_{x2}Ga_{1-x2}N$ (0<x2≤1 and x1<x2), first to third electrodes, a conductive portion, first insulating layer, and a second insulating layer. The first electrode is separated from the first semiconductor region in a first direction. The second electrode is separated from the first semiconductor region in the first direction. A second direction from the first electrode toward the second electrode crosses the first direction. The third electrode is separated from the first semiconductor region in the first direction. A position in the second direction of the third electrode is between a position in the second direction of the first electrode and a position in the second direction of the second electrode. The third electrode includes a first portion and a second portion. The conductive portion is separated from the first semiconductor region in the first direction. A position in the second direction of the conductive portion is between the position in the second direction of the third electrode and the position in the second direction of the second electrode. The second semiconductor region includes first to fourth partial regions. The first partial region is electrically connected to the first electrode. The second partial region is electrically connected to the second electrode. The third partial region is positioned between the second portion and the first semiconductor region in the first direction. The fourth partial region is positioned between the conductive portion and the first semiconductor region in the first direction. A length along the first direction of the third partial region is longer than a length along the first direction of the fourth partial region. A portion of the first insulating layer is provided between the first portion and the first semiconductor region in the first direction. A direction from at least a part of the first insulating layer toward the second semiconductor region is aligned with the second direction. The second insulating layer includes a first insulating portion and a second insulating portion. The first insulating portion is positioned between the second portion and the third partial region in the first direction. The second insulating portion is positioned between the conductive portion and the fourth partial region in the first direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first semiconductor region 10, a second semiconductor region 20, first to third electrodes 51 to 53, a conductive portion 40, a first insulating layer 61, and a second insulating layer 62.

The first semiconductor region 10 includes $Al_{x1}Ga_{1-x1}N$ ($0 \leq x1 < 1$). The first semiconductor region 10 is, for example, a GaN layer.

The second semiconductor region 20 includes $Al_{x2}Ga_{1-x2}N$ ($0 < x2 \leq 1$ and $x1 < x2$). The second semiconductor region 20 is, for example, AlGaN. The composition ratio (x2) of Al in the second semiconductor region 20 is, for example, not less than 0.1 and not more than 0.4.

In the example, a buffer layer 15 is provided on a substrate 10s. The first semiconductor region 10 is provided on the buffer layer 15. The second semiconductor region 20 is provided on the first semiconductor region 10.

The first electrode 51 is separated from the first semiconductor region 10 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

A second electrode 52 is separated from the first semiconductor region 10 in the first direction (the Z-axis direction). A second direction from the first electrode 51 toward the second electrode 52 crosses the first direction. The second direction is, for example, the X-axis direction.

The third electrode 53 is separated from the first semiconductor region 10 in the first direction (the Z-axis direction). For example, the third electrode 53 is provided between the first electrode 51 and the second electrode 52 in the X-axis direction. The position in the second direction (e.g., the X-axis direction) of the third electrode 53 is between the position in the second direction of the first electrode 51 and the position in the second direction of the second electrode 52.

The third electrode 53 includes a first portion 53a and a second portion 53b. For example, the second portion 53b is a portion extending along the X-axis direction from the first portion 53a. The second portion 53b is, for example, a protrusion.

The conductive portion 40 is separated from the first semiconductor region 10 in the first direction (the Z-axis direction). The conductive portion 40 is provided between the third electrode 53 and the second electrode 52 in the X-axis direction. The position in the second direction (e.g., the X-axis direction) of the conductive portion 40 is between the position in the second direction of the third electrode 53 and the position in the second direction of the second electrode 52.

The second semiconductor region 20 includes first to third partial regions 20a to 20c. The first partial region 20a is electrically connected to the first electrode 51. For example, the first partial region 20a has an ohmic contact with the first electrode 51. A second partial region 20b is electrically connected to the second electrode 52. For example, the second partial region 20b has an ohmic contact with the second electrode 52.

In the example, the first partial region 20a is positioned between the first electrode 51 and the first semiconductor region 10 in the first direction (the Z-axis direction). The second partial region 20b is positioned between the second electrode 52 and the first semiconductor region 10 in the first direction.

The third partial region 20c is positioned between the second portion 53b and the first semiconductor region 10 in the first direction (the Z-axis direction).

In the example, the direction from at least a portion of the third electrode 53 toward the second semiconductor region is aligned with the second direction (e.g., the X-axis direction). For example, at least a portion of the third electrode 53 overlaps the second semiconductor region 20 in the X-axis direction.

A portion of the first insulating layer 61 is provided between the first portion 53a and the first semiconductor region 10 in the first direction (the Z-axis direction). The direction from at least a part of the first insulating layer 61 toward the second semiconductor region 20 is aligned with the second direction (e.g., the X-axis direction). In the example, another portion of the first insulating layer 61 is provided between the first portion 53a and the second semiconductor region 20 in the second direction (e.g., the X-axis direction).

The second insulating layer 62 includes a first insulating portion 62a and a second insulating portion 62b. The first insulating portion 62a is positioned between the second portion 53b and the third partial region 20c in the first direction (the Z-axis direction). The second insulating portion 62b is positioned between the conductive portion 40 and the second semiconductor region 20 in the first direction.

For example, the first electrode 51 corresponds to a source electrode. For example, the second electrode 52 corresponds to a drain electrode. For example, the third electrode 53 corresponds to a gate electrode. The semiconductor device 110 is, for example, a HEMT (High Electron Mobility Transistor). The semiconductor device 110 is, for example, a normally-off transistor. The semiconductor device 110 is, for example, the recessed-type.

For example, the first semiconductor region 10 includes a region at the vicinity of the second semiconductor region 20. A two-dimensional electron gas 10E (a 2DEG) is formed in the region at the vicinity. For example, the two-dimensional electron gas 10E widens substantially parallel to the X-Y plane. For example, the first semiconductor region 10 functions as an electron transport layer. For example, the second semiconductor region 20 functions as an electron supply layer.

A conductive member 45 is provided in the example. In the example, the conductive member 45 electrically connects the first electrode 51 and the conductive portion 40. The conductive member 45 may electrically connect the first electrode 51 and the conductive portion 40 at a position not included in the cross section illustrated in FIG. 1.

For example, the conductive portion 40 functions as a field plate.

The length (the thickness) along the first direction (the Z-axis direction) of the first insulating portion 62a is taken as a first length d1. The length (the thickness) along the first direction of the second insulating portion 62b is taken as a second length d2. In the embodiment, the first length d1 is longer than the second length d2.

In the embodiment, the thickness of the portion (the first insulating portion 62a) of the second insulating layer 62 positioned under the second portion 53b is thicker than the thickness of the portion (the second insulating portion 62b) of the second insulating layer 62 positioned under the conductive portion 40.

Thereby, for example, the characteristics (e.g., the threshold voltage, etc.) of the semiconductor device can be stabilized.

For example, a positive voltage (e.g., +10 V or the like) is applied to the third electrode 53 in the on-state of the semiconductor device 110. For example, PBTI (Positive Bias Temperature Instability) occurs; and, for example, the threshold voltage fluctuates. In the embodiment, the thickness (the first length d1) of the insulating layer (the first insulating portion 62a) between the third electrode 53 and the second semiconductor region 20 is thick. Thereby, the electric field at the first insulating portion 62a is relaxed. For example, the fluctuation of the characteristics due to the PBTI can be suppressed.

Further, because the thickness (the first length d1) of the first insulating portion 62a is thick, for example, a gate-drain capacitance Cgd can be small. Thereby, for example, good response characteristics are obtained.

On the other hand, in the off-state of the semiconductor device 110, for example, DC collapse (current collapse) occurs due to the electric field between the second electrode 52 and the third electrode 53. For example, the threshold voltage increases. For example, the on-resistance increases. In such a case, in the embodiment, the thickness (the second length d2) of the insulating layer (the second insulating portion 62b) between the conductive portion 40 and the second semiconductor region 20 is thin. Thereby, the effect of the electric field relaxation due to the conductive portion 40 is increased. By the conductive portion 40, for example, the effect of the electric field relaxation of the gate end (or the recess portion) is increased.

For example, a reference example may be considered in which both the thickness (the first length d1) of the first insulating portion 62a and the thickness (the second length d2) of the second insulating portion 62b are thick. It is considered that the fluctuation of the characteristics due to the PBTI can be suppressed in the reference example. However, in the off-state, the voltage at which depleting occurs is high at the portion of the third electrode 53 overlapping the second portion 53b. For example, the electric field concentrates at the end portion of the first portion 53a (the recess portion) of the third electrode 53. Thereby, the threshold voltage fluctuates easily. The fluctuation of the threshold voltage becomes pronounced in the case where the thickness of the second insulating layer 62 is thick.

In the embodiment, the thickness (the second length d2) of the second insulating portion 62b is thin. Thereby, the electric field (e.g., the electric field of the gate end) can be relaxed effectively by the conductive portion 40. The fluctuation of the threshold voltage caused by the electric field in the off-state can be suppressed.

Figure 2:
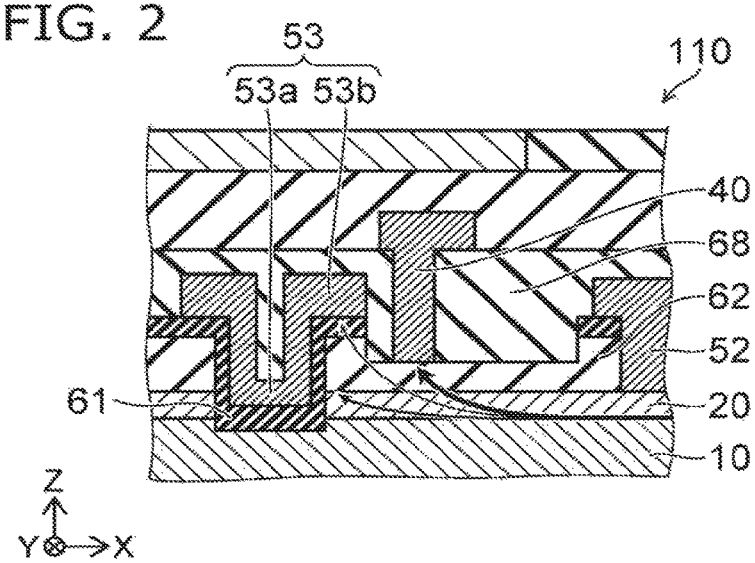
FIG. 2 is a schematic cross-sectional view illustrating the semiconductor device according to the first embodiment.

FIG. 2 is a schematic cross-sectional view illustrating the semiconductor device according to the first embodiment.

FIG. 2 illustrates the characteristics in the off-state. By providing the conductive portion 40 as shown in FIG. 2, the electric field from the second electrode 52 toward the conductive portion 40 increases. Thereby, the electric field from the second electrode 52 toward the first portion 53a of the third electrode 53 can be low. By setting the second insulating portion 62b to be thin, the electric field toward the first portion 53a can be reduced effectively.

Thus, in the embodiment, the fluctuation of the threshold voltage caused by the electric field in the off-state can be suppressed. Further, as described above, the fluctuation of the threshold voltage due to the PBTI in the on-state can be suppressed. According to the embodiment, a semiconductor device can be provided in which it is possible to stabilize the characteristics. Further, the gate-drain capacitance Cgd can be small.

In the embodiment, the first length d1 is 1.2 times the second length d2 or more. The first length d1 may be 1.5 times the second length d2 or more. The first length d1 may be 2 times the second length d2 or more.

In the case where the second insulating layer 62 includes silicon nitride, the first length d1 (the thickness) is, for example, not less than 5 nm and not more than 1 μm. The second length d2 (the thickness) is, for example, not less than 1 nm and not more than 100 nm. The first length d1 may be, for example, not less than 20 nm and not more than 200 nm. The second length d2 may be, for example, not less than 1 nm and not more than 20 nm.

In the semiconductor device 110 as shown in FIG. 1, a first level-difference portion 62p is provided in the second insulating layer 62. The first level-difference portion 62p includes the level difference (the portion where the thickness changes) between the first insulating portion 62a and the second insulating portion 62b. In the example shown in FIG. 1, the first level-difference portion 62p overlaps, in the first direction (the Z-axis direction), an end portion 53e of the third electrode 53. The end portion 53e includes the end in the X-axis direction of the third electrode 53 (the end on the second electrode 52 side).

As described below, the first level-difference portion 62p may be between the conductive portion 40 and the end portion 53e of the third electrode 53 in the X-axis direction.

In the example as shown in FIG. 1, the second electrode 52 also includes a protrusion. The thickness of the portion of the second insulating layer 62 positioned under the protrusion of the second electrode 52 is thicker than the thickness (the second length d2) of the portion of the second insulating layer 62 positioned under the conductive portion 40.

For example, the second electrode 52 includes a third portion 52c and a fourth portion 52d. The direction from the second insulating portion 62b toward the third portion 52c is aligned with the second direction (e.g., the X-axis direction). For example, the third portion 52c overlaps the second insulating layer 62 in the X-axis direction.

A portion of the second semiconductor region 20 is positioned between the fourth portion 52d and the first semiconductor region 10 in the first direction (the Z-axis direction). For example, the fourth portion 52d does not overlap the second insulating layer 62 in the X-axis direction.

On the other hand, the second insulating layer 62 further includes a third insulating portion 62c. The third insulating portion 62c is positioned between the fourth portion 52d and the portion of the second semiconductor region 20 recited above in the first direction (the Z-axis direction). The length (the thickness) along the first direction (the Z-axis direction)

of the third insulating portion 62c is taken as a third length d3. The third length d3 is longer than the second length d2.

Thus, on the second electrode 52 side as well, a level difference is provided in the second insulating layer 62. For example, there are cases where the depleted portion of the two-dimensional electron gas 10E reaches the vicinity of the drain under off-state stress. By providing the thick third insulating portion 62c, the electric field stress that is applied to the third insulating portion 62c can be relaxed.

For example, the second insulating layer 62 further includes a second level-difference portion 62q. The second level-difference portion 62q includes a level difference (a portion where the thickness changes) between the third insulating portion 62c and the second insulating portion 62b. The second level-difference portion 62q in the X-axis direction is positioned between the conductive portion 40 and the second electrode 52. The position in the second direction (e.g., the X-axis direction) of the second level-difference portion 62q is between the position in the second direction of the conductive portion 40 and the position in the second direction of an end portion 52e of the second electrode 52. Thereby, the effect of the electric field relaxation at the third insulating portion 62c is obtained while obtaining the effect of the electric field relaxation at the gate end. The end portion 52e includes the end in the second direction (the X-axis direction) of the second electrode 52 (the end on the third electrode 53 side).

In the embodiment as shown in FIG. 1, the distance along the second direction (the X-axis direction) between the first electrode 51 and the third electrode 53 is shorter than the distance along the second direction between the second electrode 52 and the third electrode 53. For example, the distance between the source electrode and the gate electrode is shorter than the distance between the drain electrode and the gate electrode. Thereby, for example, an element that has a high breakdown voltage and a low on-resistance is obtained.

As shown in FIG. 1, at least a portion of the first insulating layer 61 overlaps the first semiconductor region 10 in the second direction (the X-axis direction). For example, the bottom portion of the recess of the gate reaches the first semiconductor region 10. For example, the two-dimensional electron gas 10E can be divided reliably. A reliable normally-off operation is obtained.

In the embodiment, the first electrode 51 and the second electrode 52 include, for example, at least one selected from the group consisting of Al, Cu, Au, Ti, and Ni. The third electrode 53 includes, for example, at least one selected from the group consisting of Al, Cu, Au, Ti, and Ni. The third electrode 53 includes, for example, TiN.

The first insulating layer 61 includes, for example, silicon and oxygen. For example, it is favorable for the first insulating layer 61 to include silicon oxide. The second insulating layer 62 includes silicon and nitrogen. For example, it is favorable for the second insulating layer 62 to include silicon nitride. For example, the second insulating layer 62 includes a portion contacting the second semiconductor region 20. For example, this portion includes silicon nitride.

At least one of the first insulating layer 61 or the second insulating layer 62 includes a first element and a second element. The first element includes at least one selected from the group consisting of aluminum and silicon. The second element includes at least one selected from the group consisting of oxygen and nitrogen. At least one of the first insulating layer 61 or the second insulating layer 62 includes an oxide, a nitride, or an oxynitride.

At least one of the first insulating layer 61 or the second insulating layer 62 may include a first film including the first element recited above and the second element recited above and a second film including a third element and a fourth element. The third element includes at least one selected from the group consisting of aluminum and silicon. The fourth element includes at least one selected from the group consisting of oxygen and nitrogen. The composition of the first film and the composition of the second film are different from each other. The first film and the second film are stacked with each other.

As shown in FIG. 1, an insulating member 68 is further provided in the example. The insulating member 68 is provided between the third electrode 53 and the conductive portion 40, between the conductive portion 40 and the second electrode 52, and between the third electrode 53 and the first electrode 51. The insulating member 68 includes, for example, at least one selected from the group consisting of silicon oxide, silicon nitride, silicon oxynitride, and aluminum oxide.

The substrate 10s is, for example, a sapphire substrate or a silicon substrate. The buffer layer 15 includes, for example, an AlGaN layer and a GaN layer. The buffer layer 15 may include, for example, multiple AlGaN layers and multiple GaN layers stacked alternately.

The conductive portion 40 may include, for example, a material included in the third electrode 53. The same material as the third electrode 53 may be used as the conductive portion 40. For example, the leakage current can be suppressed. For example, high insulative properties are obtained. The conductive portion 40 may include, for example, a material included in at least one of the first electrode 51 or the second electrode 52. The same material as at least one of the first electrode 51 or the second electrode 52 may be used as the conductive portion 40. For example, the manufacturing processes become simple. In the embodiment, for example, the conductive portion 40 may include a material that is different from the materials of the first to third electrodes 51 to 53.

In the embodiment, there may be a case where an element included in the second semiconductor region 20 is detected in a region including the first semiconductor region 10 and the first insulating layer 61. For example, there are cases where the first semiconductor region 10 includes GaN; the second semiconductor region 20 includes AlGaN; and the first insulating layer 61 includes silicon nitride. In such a case, the Al that is included in the second semiconductor region 20 may be detected in the region between the first semiconductor region 10 and the first insulating layer 61. For example, there are cases where such a state is observed according to the analysis method, etc. For example, there are cases where a thin region that includes an element included in the second semiconductor region 20 is observed in the region between the first semiconductor region 10 and the first insulating layer 61.

Several examples of the semiconductor device according to the embodiment will now be described. Hereinbelow, a description is omitted as appropriate for the same portions as the configuration of the semiconductor device 110.

Figure 3:
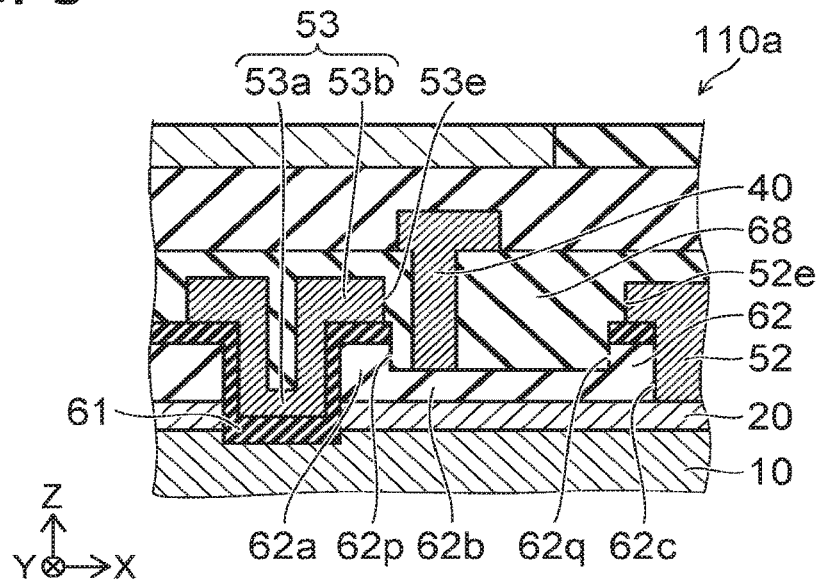
FIG. 3 is a schematic cross-sectional view illustrating a semiconductor device according to the first embodiment.

FIG. 3 is a schematic cross-sectional view illustrating a semiconductor device according to the first embodiment.

FIG. 3 illustrates a portion of the semiconductor device 110a. In the semiconductor device 110a, the position of the first level-difference portion 62p of the second insulating layer 62 is different from the position of the first level-difference portion 62p of the second insulating layer 62 of the semiconductor device 110. Otherwise, the configuration of the semiconductor device 110a is the same as the configuration of the semiconductor device 110.

In the semiconductor device 110a, the position in the second direction (e.g., the X-axis direction) of the first level-difference portion 62p is between the position in the second direction of the end portion 53e of the third electrode 53 and the position in the second direction of the conductive portion 40. The end portion 53e includes the end in the second direction (the X-axis direction) of the third electrode 53.

FIG. 4 to FIG. 11 are schematic cross-sectional views illustrating semiconductor devices according to the first embodiment.

Figure 4:
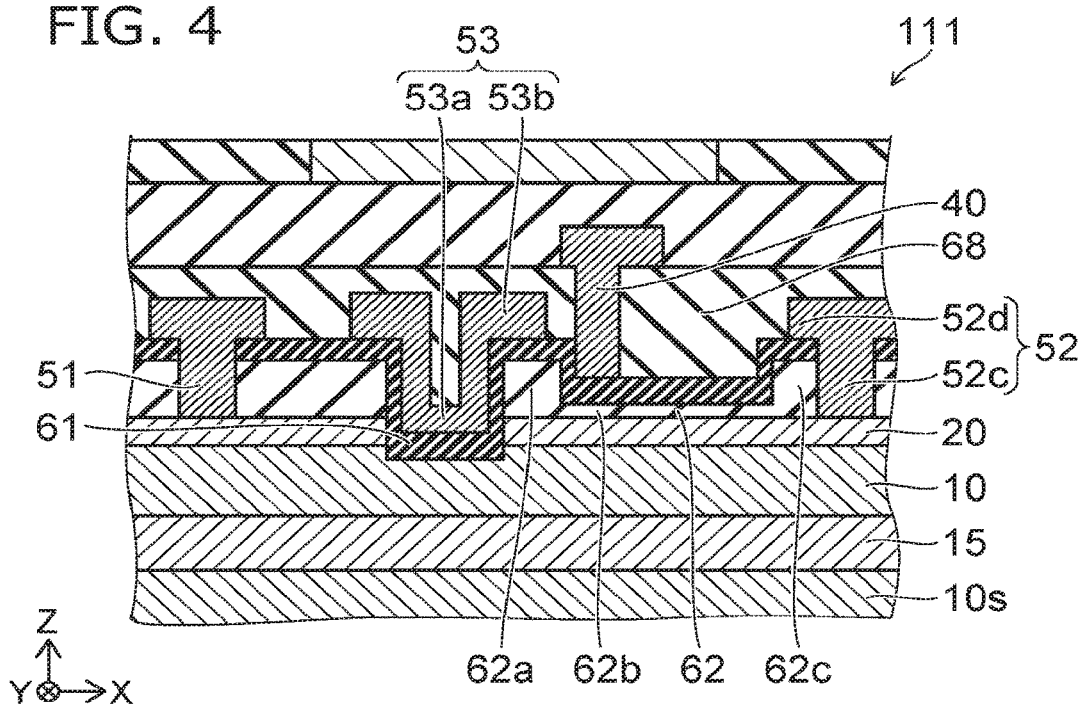
FIG. 4 is a schematic cross-sectional view illustrating a semiconductor device according to the first embodiment.

In a semiconductor device 111 as shown in FIG. 4, a portion of the first insulating layer 61 is positioned between the conductive portion 40 and the second semiconductor region 20 in the first direction (the Z-axis direction).

Figure 5:
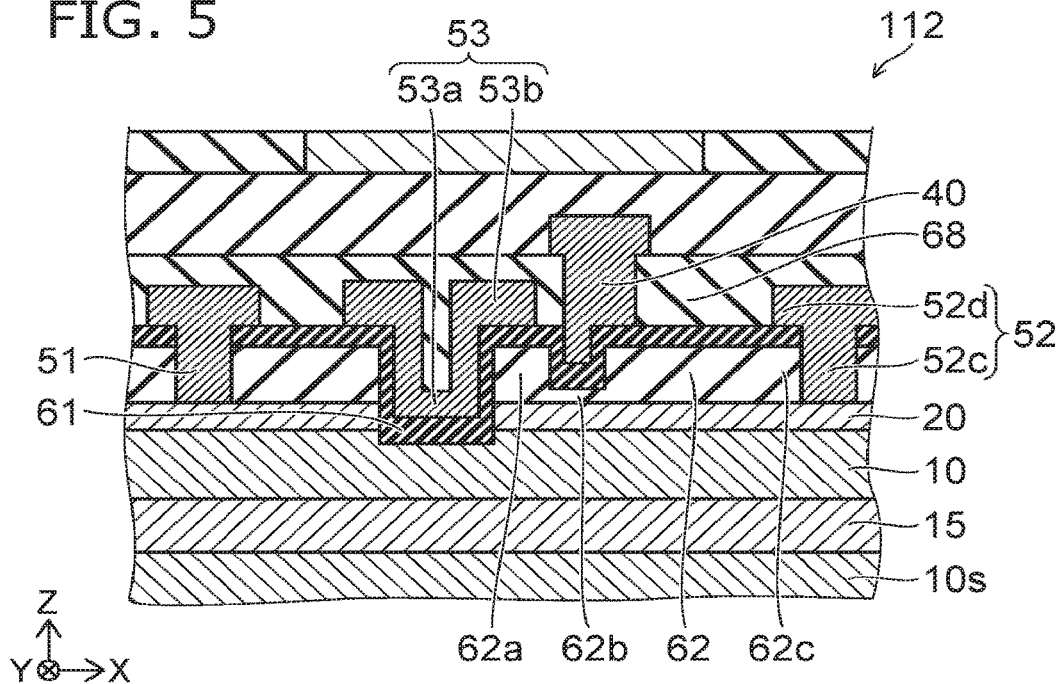
FIG. 5 is a schematic cross-sectional view illustrating a semiconductor device according to the first embodiment.

In a semiconductor device 112 as shown in FIG. 5, the conductive portion 40 includes a portion overlapping the first insulating layer 61 in the second direction (e.g., the X-axis direction), and a portion not overlapping the first insulating layer 61 in the second direction. For example, the conductive portion 40 includes a level difference. For example, a multilevel field plate is formed; and the electric field can be relaxed in stages.

Figure 6:
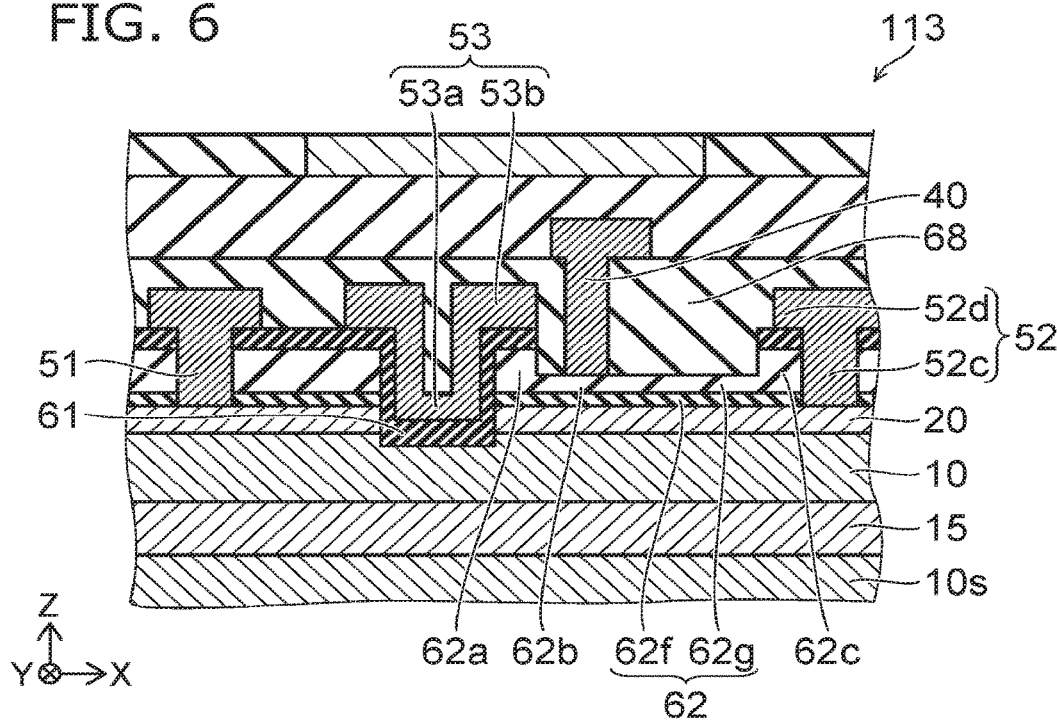
FIG. 6 is a schematic cross-sectional view illustrating a semiconductor device according to the first embodiment.

In a semiconductor device 113 as shown in FIG. 6, the second insulating layer 62 includes a first film 62f and a second film 62g. The first film 62f is positioned between the second film 62g and the second semiconductor region 20. For example, the first film 62f includes silicon and nitrogen. The second film 62g includes silicon and oxygen. The second film 62g may include silicon, oxygen, and nitrogen. The second film 62g may include aluminum and oxygen. The second film 62g may include aluminum, oxygen, and nitrogen. Because the second insulating layer 62 includes multiple films, for example, the reliability can be increased while forming a good interface between the second insulating layer 62 and the second semiconductor region 20.

Figure 7:
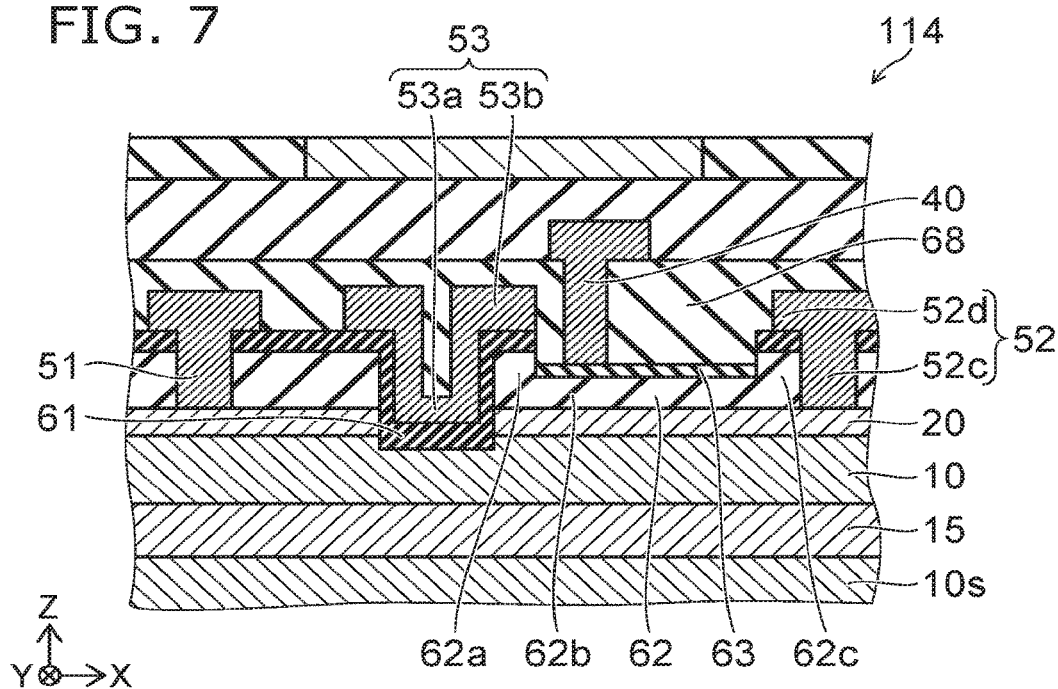
FIG. 7 is a schematic cross-sectional view illustrating a semiconductor device according to the first embodiment.

As shown in FIG. 7, a semiconductor device 114 further includes a third insulating layer 63. The third insulating layer 63 includes a portion provided between the second insulating portion 62b and the conductive portion 40. The third insulating layer 63 includes, for example, at least one selected from the group consisting of silicon oxide, silicon nitride, silicon oxynitride, aluminum oxide, aluminum nitride, and aluminum oxynitride.

Figure 8:
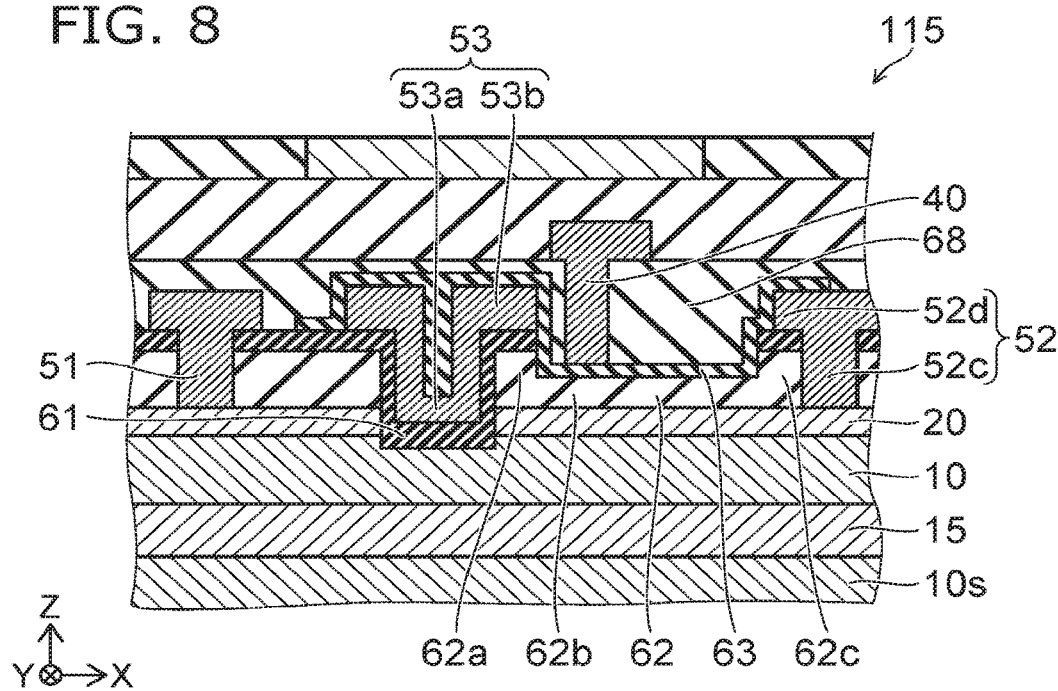
FIG. 8 is a schematic cross-sectional view illustrating a semiconductor device according to the first embodiment.

As shown in FIG. 8, the third insulating layer 63 is provided in a semiconductor device 115 as well. In the semiconductor device 115, at least a portion of the third electrode 53 is positioned between the third insulating layer 63 and the first insulating layer 61.

In the semiconductor devices 111 to 115 recited above as well, for example, a semiconductor device can be provided in which it is possible to stabilize the characteristics. For example, the fluctuation of the threshold voltage due to the PBTI in the on-state can be suppressed. For example, the fluctuation of the threshold voltage caused by the electric field in the off-state can be suppressed. Further, the gate-drain capacitance Cgd can be small.

Figure 9:
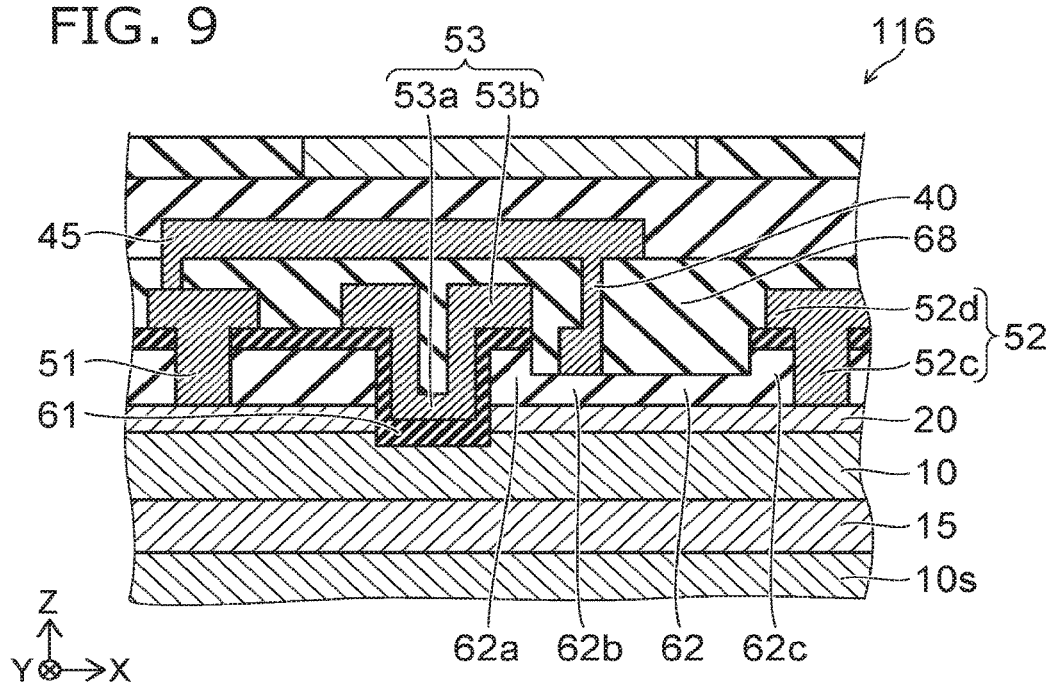
FIG. 9 is a schematic cross-sectional view illustrating a semiconductor device according to the first embodiment.

As shown in FIG. 9, the conductive member 45 is provided in a semiconductor device 116. The conductive member 45 electrically connects the first electrode 51 and the conductive portion 40. As shown in FIG. 9, at least a portion of the third electrode 53 may be provided between the first semiconductor region 10 and a portion of the conductive member 45.

Figure 10:
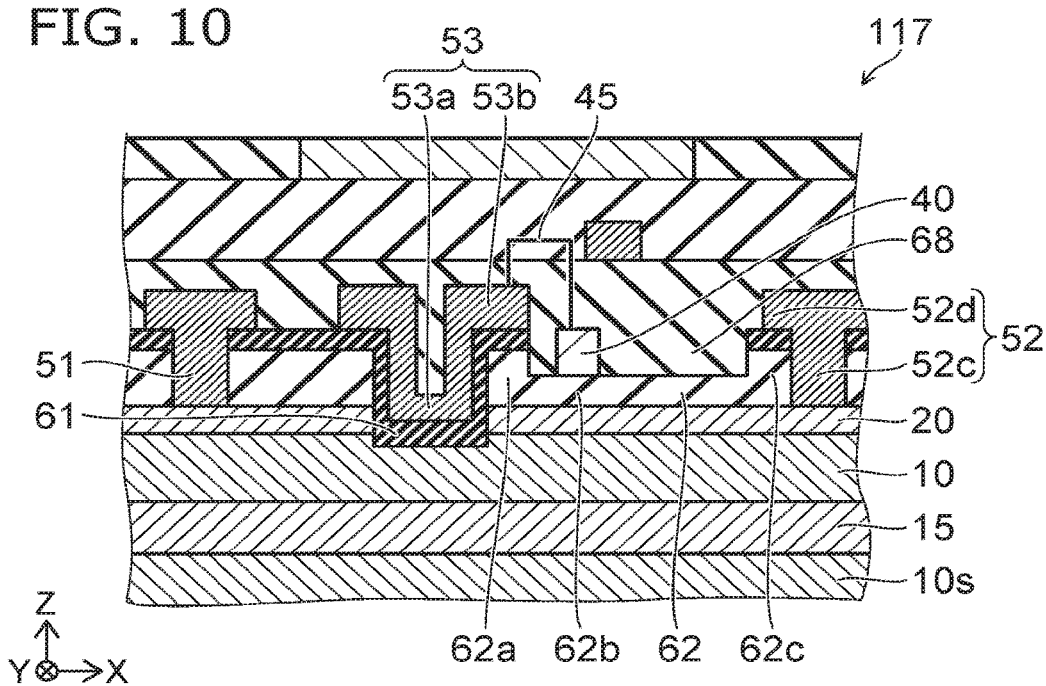
FIG. 10 is a schematic cross-sectional view illustrating a semiconductor device according to the first embodiment.

As shown in FIG. 10, the conductive member 45 is provided in a semiconductor device 117. The conductive member 45 electrically connects the third electrode 53 and the conductive portion 40. In the semiconductor device 117, the electric field in the off-state can be relaxed. For example, the fluctuation of the characteristics caused by the electric field in the off-state can be suppressed.

Figure 11:
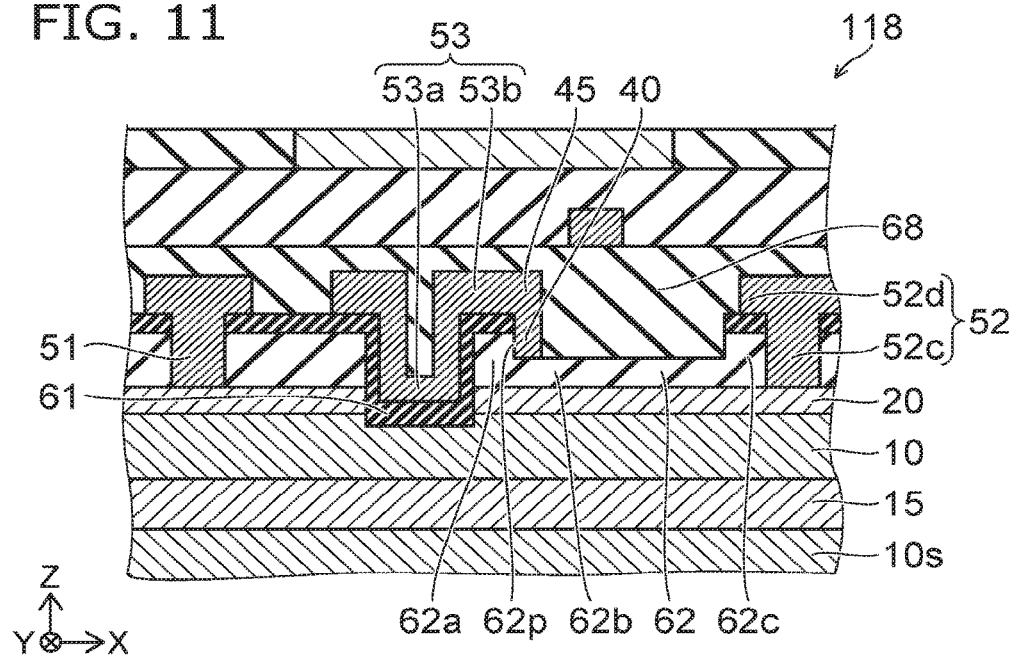
FIG. 11 is a schematic cross-sectional view illustrating a semiconductor device according to the first embodiment.

In a semiconductor device 118 as shown in FIG. 11, the conductive portion 40 is continuous with the third electrode 53. The intermediate portion between the third electrode 53 and the conductive portion 40 corresponds to the conductive member 45. In the example, the conductive portion 40 contacts the first level-difference portion 62p of the second insulating layer 62.

On the other hand, in the semiconductor devices 110, 110a, and 111 to 117 recited above, at least one of the insulating member 68, the first insulating layer 61, or the third insulating layer 63 is provided between the conductive portion 40 and the first level-difference portion 62p. For example, the conductive portion 40 is separated from the first level-difference portion 62p.

In the semiconductor devices 110, 110a, and 111 to 118 recited above, a level difference may be provided in the second insulating layer 62 between the third electrode 53 and the first electrode 51 in the second direction.

Second Embodiment

Figure 12:
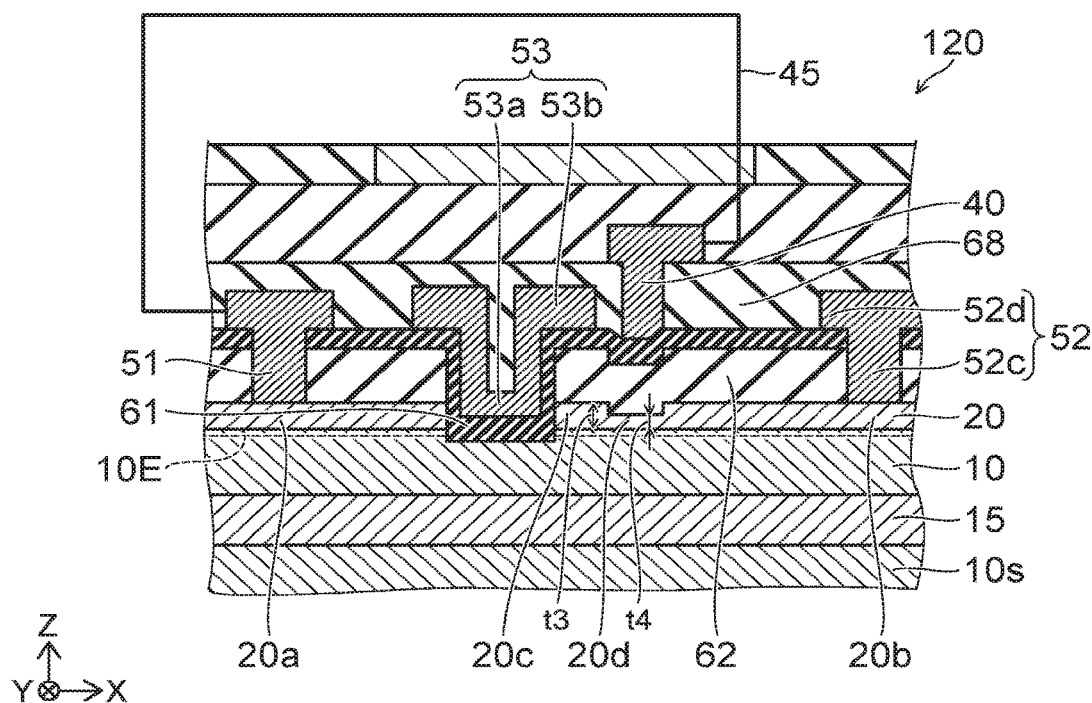
FIG. 12 is a schematic cross-sectional view illustrating a semiconductor device according to a second embodiment.

FIG. 12 is a schematic cross-sectional view illustrating a semiconductor device according to a second embodiment.

As shown in FIG. 12, the semiconductor device 120 according to the embodiment also includes the first semiconductor region 10, the second semiconductor region 20, the first to third electrodes 51 to 53, the conductive portion 40, the first insulating layer 61, and the second insulating layer 62.

In the example as well, the first semiconductor region 10 includes $Al_{x1}Ga_{1-x1}N$ ($0 \leq x1 < 1$). The second semiconductor region 20 includes $Al_{x2}Ga_{1-x2}N$ ($0 < x2 \leq 1$ and $x1 < x2$).

The first to third electrodes 51 to 53 and the conductive portion 40 are separated from the first semiconductor region 10 in the first direction (the Z-axis direction). The second direction (e.g., the X-axis direction) from the first electrode 51 toward the second electrode 52 crosses the first direction. The position in the second direction of the third electrode 53 is between the position in the second direction of the first electrode 51 and the position in the second direction of the second electrode 52. In the example as well, the third electrode 53 includes the first portion 53a and the second portion 53b. The position in the second direction of the conductive portion 40 is between the position in the second direction of the third electrode 53 and the position in the second direction of the second electrode 52.

The second semiconductor region 20 includes the first to fourth partial regions 20a to 20d. The first partial region 20a is electrically connected to the first electrode 51. The second partial region 20b is electrically connected to the second electrode 52. The third partial region 20c is positioned between the second portion 53b and the first semiconductor region 10 in the first direction (the Z-axis direction). The fourth partial region 20d is positioned between the conductive portion 40 and the first semiconductor region 10 in the first direction. In the example, the first partial region 20a is positioned between the first electrode 51 and the first semiconductor region 10 in the first direction (the Z-axis direction). The second partial region 20b is positioned between the second electrode 52 and the first semiconductor region 10 in the first direction.

A length t3 (the thickness) along the first direction (the Z-axis direction) of the third partial region 20c is longer than a length t4 (the thickness) along the first direction of the fourth partial region 20d.

In the example, the direction from at least a portion of the third electrode 53 toward the second semiconductor region is aligned with the second direction (e.g., the X-axis direction). For example, at least a portion of the third electrode 53 overlaps the second semiconductor region 20 in the X-axis direction.

A portion of the first insulating layer 61 is provided between the first portion 53a and the first semiconductor region 10 in the first direction (the Z-axis direction). The direction from at least a part of the first insulating layer 61 toward the second semiconductor region 20 is aligned with the second direction (e.g., the X-axis direction). In the example, another portion of the first insulating layer 61 is provided between the first portion 53a and the second semiconductor region 20 in the second direction (the X-axis direction).

The second insulating layer 62 includes the first insulating portion 62a and the second insulating portion 62b. The first insulating portion 62a is positioned between the second portion 53b and the third partial region 20c in the first direction (the Z-axis direction). The second insulating portion 62b is positioned between the conductive portion 40 and the fourth partial region 20d in the first direction.

In the semiconductor device 120, the length t3 (the thickness) is longer than the length t4 (the thickness). Thereby, the distance between the second portion 53b and the first semiconductor region 10 is longer than the distance between the conductive portion 40 and the first semiconductor region 10. For example, the distance between the second portion 53b and the two-dimensional electron gas 10E is longer than the distance between the conductive portion 40 and the two-dimensional electron gas 10E.

In the semiconductor device 120, for example, a semiconductor device can be provided in which it is possible to stabilize the characteristics. For example, the fluctuation of the threshold voltage due to the PBTI in the on-state can be suppressed. For example, the fluctuation of the threshold voltage caused by the electric field in the off-state can be suppressed. Further, the gate-drain capacitance Cgd can be small.

In the semiconductor device 120, the conductive member 45 electrically connects the conductive portion 40 and the first electrode 51. As described in reference to the semiconductor device 117, the conductive member 45 may electrically connect the conductive portion 40 and the third electrode 53.

In the embodiment, for example, the thickness of the barrier layer (e.g., at least one of the second insulating layer 62 or the second semiconductor region 20) is thinner under the conductive portion 40 than under the protrusion of the third electrode 53. For example, the electric field of the stress in the off-state is relaxed effectively by the conductive portion 40.

In the semiconductor device 120, a level difference may be provided in the second insulating layer 62 between the third electrode 53 and the first electrode 51 in the second direction.

Figure 13:
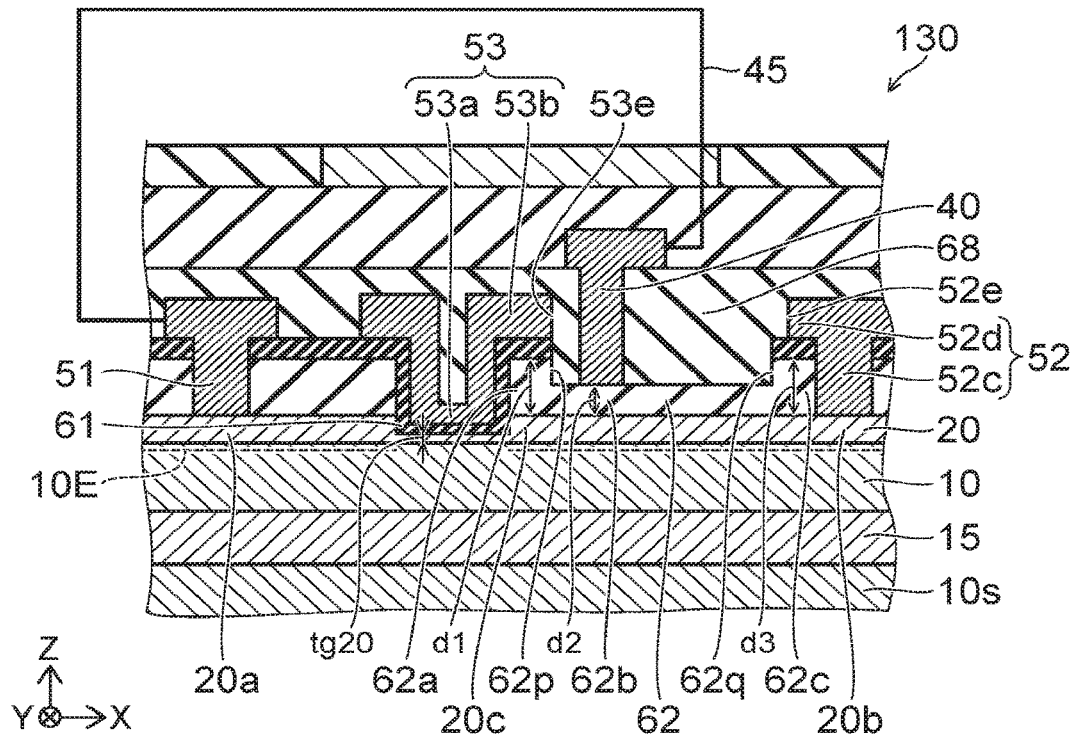
FIG. 13 is a schematic cross-sectional view illustrating a semiconductor device according to the embodiment.

FIG. 13 is a schematic cross-sectional view illustrating a semiconductor device according to the embodiment.

In the semiconductor device 130 according to the embodiment as shown in FIG. 13, the first insulating layer 61 includes a portion provided between the third electrode 53 and the first semiconductor region 10 in the first direction (the Z-axis direction). A portion of the second semiconductor region 20 may be provided between the first semiconductor region 10 and the portion of the first insulating layer 61 recited above. Otherwise, the configuration of the semiconductor device 130 is the same as the configuration of the semiconductor device 110. The characteristics are stable in the semiconductor device 130 as well.

In the semiconductor devices 110a and 111 to 118 as well, a portion of the second semiconductor region 20 may be provided between the first semiconductor region 10 and the portion of the first insulating layer 61 recited above.

Figure 14:
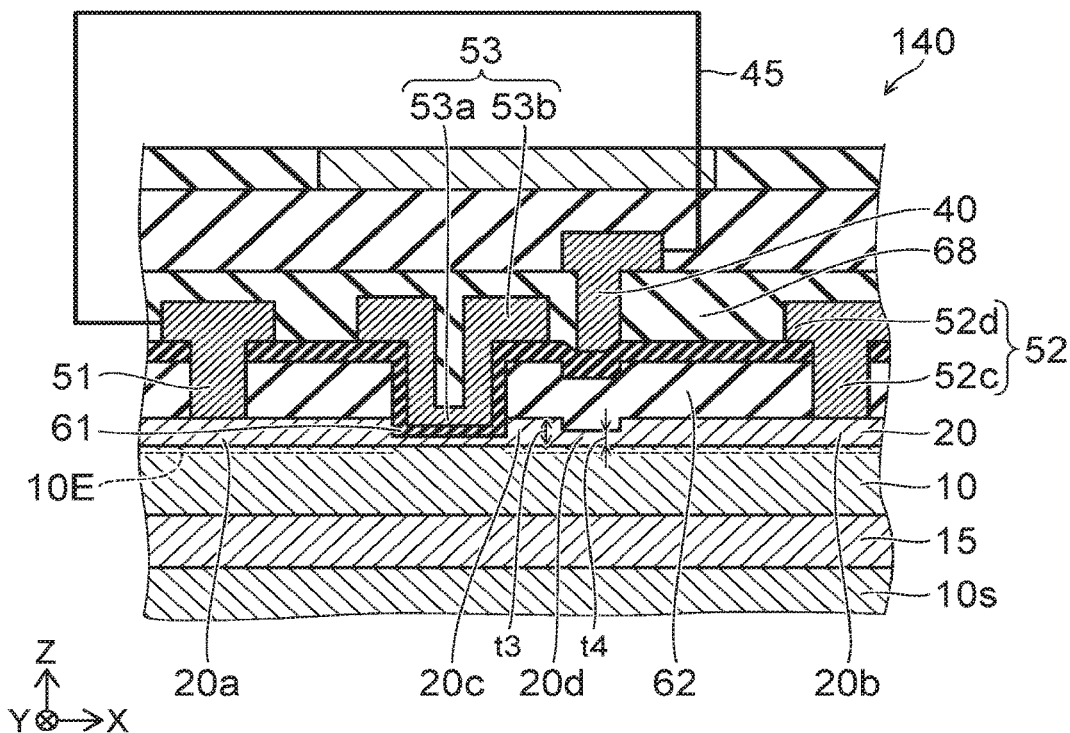
FIG. 14 is a schematic cross-sectional view illustrating a semiconductor device according to the embodiment.

FIG. 14 is a schematic cross-sectional view illustrating a semiconductor device according to the embodiment.

In the semiconductor device 140 according to the embodiment as shown in FIG. 14, the first insulating layer 61 includes a portion provided between the third electrode 53 and the first semiconductor region 10 in the first direction (the Z-axis direction). A portion of the second semiconductor region 20 may be provided between the first semiconductor region 10 and the portion of the first insulating layer 61 recited above. Otherwise, the configuration of the semiconductor device 140 is the same as the configuration of the semiconductor device 120. The characteristics are stable in the semiconductor device 140 as well.

In the semiconductor devices 130 and 140, the length (a thickness tg20) in the first direction (the Z-axis direction) of the portion of the second semiconductor region 20 recited above is, for example, not less than 1 nm and not more than 10 nm. A normally-off operation is obtained in the semiconductor devices 130 and 140 as well.

In the semiconductor device 130, a level difference may be provided in the second insulating layer 62 between the third electrode 53 and the first electrode 51 in the second direction.

According to the embodiments, a semiconductor device can be provided in which it is possible to stabilize the characteristics.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, conductive portions, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor region including $Al_{x1}Ga_{1-x1}N$ ($0 \leq x1 < 1$);
   a first electrode separated from the first semiconductor region in a first direction;
   a second electrode separated from the first semiconductor region in the first direction, a second direction from the first electrode toward the second electrode crossing the first direction;
   a third electrode separated from the first semiconductor region in the first direction, a position in the second direction of the third electrode being between a position in the second direction of the first electrode and a position in the second direction of the second electrode, the third electrode including a first portion and a second portion;
   a conductive portion separated from the first semiconductor region in the first direction, a position in the second direction of the conductive portion being between the position in the second direction of the third electrode and the position in the second direction of the second electrode;
   a second semiconductor region including $Al_{x2}Ga_{1-x2}N$ ($0 < x2 \leq 1$ and $x1 < x2$), the second semiconductor region including first to third partial regions, the first partial region being electrically connected to the first electrode, the second partial region being electrically connected to the second electrode, the third partial region being positioned between the second portion and the first semiconductor region in the first direction;
   a first insulating layer, a portion of the first insulating layer being provided between the first portion and the first semiconductor region in the first direction, a direction from at least a part of the first insulating layer toward the second semiconductor region being aligned with the second direction;
   a second insulating layer including a first insulating portion and a second insulating portion, the first insulating portion being positioned between the second portion and the third partial region in the first direction, the second insulating portion being positioned between the conductive portion and the second semiconductor region in the first direction, a first length along the first direction of the first insulating portion being longer than a second length along the first direction of the second insulating portion.

2. The device according to claim 1, wherein
   the second electrode includes a third portion and a fourth portion,
   a direction from the second insulating portion toward the third portion is aligned with the second direction,
   a portion of the second semiconductor region is positioned between the fourth portion and the first semiconductor region in the first direction,
   the second insulating layer further includes a third insulating portion,
   the third insulating portion is positioned between the fourth portion and the portion of the second semiconductor region in the first direction, and
   a third length along the first direction of the third insulating portion is longer than the second length.

3. The device according to claim 2, wherein a position in the second direction of a second level-difference portion between the third insulating portion and the second insulating portion is between the position in the second direction of the conductive portion and a position in the second direction of an end portion of the second electrode in the second direction.

4. The device according to claim 1, wherein a first level-difference portion between the first insulating portion and the second insulating portion overlaps an end portion of the third electrode in the first direction.

5. The device according to claim 1, wherein a position in the second direction of a first level-difference portion between the first insulating portion and the second insulating portion is between a position in the second direction of an end portion in the second direction of the third electrode and the position in the second direction of the conductive portion.

6. The device according to claim 1, wherein the portion of the first insulating layer is positioned between the conductive portion and the second semiconductor region in the first direction.

7. The device according to claim 1, wherein the conductive portion includes a portion overlapping the first insulating layer in the second direction and a portion not overlapping the first insulating layer in the second direction.

8. The device according to claim 1, wherein
   the second insulating layer includes a first film and a second film, and
   the first film is positioned between the second film and the second semiconductor region.

9. The device according to claim 8, wherein
   the first film includes silicon and nitrogen, and
   the second film includes silicon and oxygen.

10. The device according to claim 1, further comprising a third insulating layer including a portion provided between the second insulating portion and the conductive portion.

11. The device according to claim 10, wherein at least a portion of the third electrode is positioned between the third insulating layer and the first insulating layer.

12. The device according to claim 1, further comprising a conductive member electrically connecting the first electrode and the conductive portion.

13. The device according to claim 1, further comprising a conductive member electrically connecting the third electrode and the conductive portion.

14. The device according to claim 1, wherein at least a portion of the first insulating layer overlaps the first semiconductor region in the second direction.

15. The device according to claim 1, wherein a distance along the second direction between the first electrode and the third electrode is shorter than a distance along the second direction between the second electrode and the third electrode.

16. The device according to claim 1, wherein the first length is 1.2 times the second length or more.

17. The device according to claim 1, wherein the first length is 2 times the second length or more.

18. The device according to claim 1, wherein
the first insulating layer includes silicon and oxygen, and the second insulating layer includes silicon and nitrogen.

19. A semiconductor device, comprising:
a first semiconductor region including $Al_{x1}Ga_{1-x1}N$ ($0 \leq x1 < 1$);
a first electrode separated from the first semiconductor region in a first direction;
a second electrode separated from the first semiconductor region in the first direction, a second direction from the first electrode toward the second electrode crossing the first direction;
a third electrode separated from the first semiconductor region in the first direction, a position in the second direction of the third electrode being between a position in the second direction of the first electrode and a position in the second direction of the second electrode, the third electrode including a first portion and a second portion;
a conductive portion separated from the first semiconductor region in the first direction, a position in the second direction of the conductive portion being between the position in the second direction of the third electrode and the position in the second direction of the second electrode;
a second semiconductor region including $Al_{x2}Ga_{1-x2}N$ ($0 < x2 \leq 1$ and $x1 < x2$), the second semiconductor region including first to fourth partial regions, the first partial region being electrically connected to the first electrode, the second partial region being electrically connected to the second electrode, the third partial region being positioned between the second portion and the first semiconductor region in the first direction, the fourth partial region being positioned between the conductive portion and the first semiconductor region in the first direction, a length along the first direction of the third partial region being longer than a length along the first direction of the fourth partial region;
a first insulating layer, a portion of the first insulating layer being provided between the first portion and the first semiconductor region in the first direction, a direction from at least a part of the first insulating layer toward the second semiconductor region being aligned with the second direction; and
a second insulating layer including a first insulating portion and a second insulating portion, the first insulating portion being positioned between the second portion and the third partial region in the first direction, the second insulating portion being positioned between the conductive portion and the fourth partial region in the first direction.

20. The device according to claim 1, wherein
the first partial region is positioned between the first electrode and the first semiconductor region in the first direction, and
the second partial region is positioned between the second electrode and the first semiconductor region in the first direction.

* * * * *